United States Patent [19]

Tsutsumi et al.

[11] Patent Number: 4,889,995
[45] Date of Patent: Dec. 26, 1989

[54] APPARATUS FOR ANALYSIS EMPLOYING ELECTRON

[75] Inventors: Yoshitsugu Tsutsumi, Ibaraki; Shinjiro Ueda, Abiko; Tadashi Otaka, Katsuta, all of Japan

[73] Assignee: Hitachi, Ltd., Tokyo, Japan

[21] Appl. No.: 286,848

[22] Filed: Dec. 20, 1988

[30] Foreign Application Priority Data

Dec. 23, 1987 [JP] Japan ................................. 62-324009

[51] Int. Cl.⁴ .............................................. H01J 37/18
[52] U.S. Cl. .................................. 250/441.1; 250/289
[58] Field of Search ............................ 250/441.1, 289

[56] References Cited

U.S. PATENT DOCUMENTS 3,385,102  5/1968  Briggs .................................. 250/289
3,668,393  6/1972  Von Rauch ...................... 250/441.1

OTHER PUBLICATIONS

Santeler, Jrnl. of Vacuum Science and Technology, vol. 8, No. 1, 1971, pp. 299–307.

Primary Examiner—Jack I. Berman
Attorney, Agent, or Firm—Antonelli, Terry & Wands

[57] ABSTRACT

An analysis system in which air in a specimen exchange chamber is evacuated by an oil-sealed rotary vacuum pump and which employs electron incorporates a purge gas supply means at the inlet side of the oil-sealed rotary vacuum pump. The purge gas supply means supplies a small quantity of purge gas when the air in the specimen exchange chamber is evacuated to the almost ultimate pressure of the pump.

11 Claims, 10 Drawing Sheets

APPARATUS FOR ANALYSIS EMPLOYING ELECTRON

BACKGROUND OF THE INVENTION AND RELATED ART STATEMENT

1. Field of the Invention

The present invention relates to an apparatus for analysis which employs electrons and in which rotary vacuum pump evacuates gas or air from a specimen exchange chamber, and, more particularly, to an apparatus for analysis which employs electrons and in which the evacuated side of the apparatus is prevented from being contaminated by a vacuum pump oil.

2. Description of the Related Art

Means for preventing the interior of a vacuum chamber in a vacuum system from being contaminated by an oil backstreaming from a vacuum pump employing oil is described on pp. 299 to 307 of *THE JOURNAL OF VACUUM SCIENCE AND TECHNOLOGY*, VOL. 8, No. 1 (issued in 1971). In a method described in this publication, on the basis of the fact that oil contamination increases rapidly when the pressure at the inlet of the oil-sealed rotary vacuum pump decreases below 13 Pa (0.1 Torr), a dried nitrogen purging portion is arranged at the inlet of the oil-sealed rotary vacuum pump and prevents the pressure of the inlet from decreasing below a level from 13 to 40 Pa (0.1 to 0.3 Torr)

The increase in magnification of analysis systems which employ electrons such as electron microscopes has been advanced in recent years, but the further increase has been arrested by the contamination of microscope columns by an oil backstreaming from the oil-sealed rotary vacuum pumps used to evacuate air from specimen exchange chambers. Particularly, when an oil-sealed rotary vacuum pump operates at the almost ultimate pressure of the pump, this backstreaming of oil becomes a high degree. However, the above-described conventional purging method maintains the pressure of the inlet of the vacuum pump above 13 Pa (0.1 Torr) by purging in order to prevent the interior of the vacuum chamber from being contaminated by the oil backstreaming to the vacuum chamber from the oil-sealed rotary vacuum pump. So, when this conventional purging method is applied to the electron microscope, the pressure in the specimen chamber from which unnecessary gas has been evacuated is a high degree, so that the pressure in the specimen chamber is not be decreased below 13 Pa (0.1 Torr) in order to maintain the clean environment of the specimen chamber.

SUMMARY OF THE INVENTION

Accordingly, an object of the present invention is to provide an analysis apparatus in which high degrees of the cleanliness and vacuum of a specimen chamber are maintained.

Another object of the present invention is to provide an analysis apparatus with which analysis or observation can be continued for long period.

Another object of the present invention is to provide an analysis apparatus which makes a high degree of resolution in analysis possible.

Another object of the present invention is to provide an analysis apparatus in which the interior of the specimen chamber is made clean by a simple additional equipment.

The above-described object of the present invention regarding the apparatus for analysis employing electron and having the specimen chamber from which air is evacuated by an oil-sealed rotary vacuum pump, can be attained by that on the upstream side of the oil-sealed rotary vacuum pump, a purge gas supplying means is arranged, the purge gas supplying means supplying a small quantity of purge gas while the air is evacuated from the specimen exchange chamber by the ultimate pressure of the pump.

In the present invention, the purge gas is supplied by the purge gas supplying means arranged on the upstream side of the oil-sealed rotary vacuum pump when air in the specimen exchange chamber in the analysis apparatus employing electrons is evacuated to the ultimate pressure of the vacuum pump, the quantity of supplied purge gas being regulated at the minimum degree needed to prevent the oil used in the oil-sealed rotary vacuum pump from flowing backward to the inlet side thereof. In consequence, the backstreaming of the oil of the vacuum pump toward the specimen exchange chamber can be suppressed by this purge gas. At this time, the supplied quantity of purge gas is about one tenth in comparison with the purge gas supplied in the conventional purging method, so that a clean vacuum state can be provided without an increase in the ultimate pressure of the vacuum evacuation system, thereby an apparatus for analysis employing electron in which the oil contamination of the evacuation system is suppressed, is provided.

DETAILED DESCRIPTION OF THE PREFERRED EMBODIMENTS

The embodiments according to the present invention will be described below with the accompanying drawings thereof in which a scanning electron microscope is shown as an apparatus for analysis employing electron.

Figure 1:
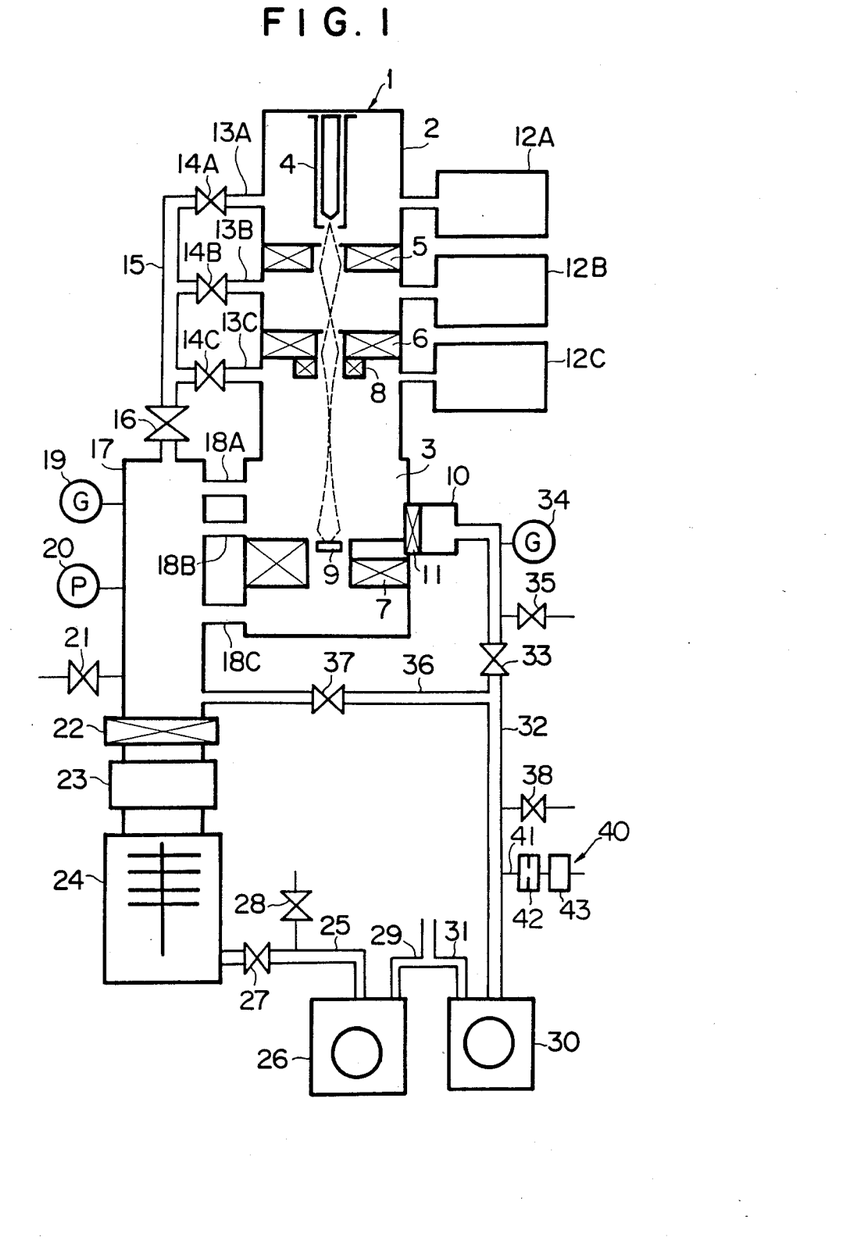
FIG. 1 is a schematic view of a scanning electron microscope, showing a first embodiment of the present invention.

In FIG. 1 which shows a first embodiment of the scanning electron microscope to which the present invention is applied, a scanning electron microscope 1 includes a microscope column 2 and a specimen chamber 3 formed below the microscope column 2. The microscope column 2 incorporates an electron gun 4 and an electron lens system which consists of a first condenser lens 5, a second condenser lens 6, an objective lens 7, and a deflection system of electron beam 8 for deflecting a focused electron beam on a specimen during scanning operation. The specimen chamber 3 is provided with a specimen exchange chamber 10 from which a specimen 9 is delivered into the specimen chamber 3, the specimen exchange chamber 10 being connected to the specimen chamber 3 through a gate valve 11.

Next, a vacuum pumping system for evacuating air from the interiors of the microscope column 2, the specimen chamber 3 and the specimen exchange chamber 10 will be described below. The microscope column 2 is equipped with a main pumping system constituted by three ultra-high vacuum pumps 12A to 12C, and three roughing pipes 13A to 13C for roughing the interior of the microscope column 2 are coupled to the microscope column 2. The three roughing pipes 13A to 13C are respectively provided with a first roughing valve 14A, a second roughing valve 14B and a third roughing valve 14C. The roughing pipes 13A to 13C are connected to a roughing pipe 15 which is connected to one end of a manifold 17 through a manifold valve 16. The manifold 17 communicates with the specimen chamber 3 through specimen chamber exhausting pipes 18A to 18C. The manifold 17 is provided with a Pirani gauge 19 for measuring a roughing pressure, a Penning gauge 20 for measuring a main vacuum pumping pressure, and a leak valve 21 through which gas is inserted into the microscope column 2. Another end of the manifold 17 is connected through a manifold gate valve 22 and a cold trap 23 to a turbo molecular pump 24 which acts as a roughing vacuum pumping pump. The outlet of the turbo molecular pump 24 is connected through a suction pipe 25 to a first oil-sealed rotary vacuum pump 26. A valve 27 for the first oil-sealed rotary vacuum pump 26 is arranged between the suction pipe 25 and the first oil-sealed rotary vacuum pump 26, and a leak valve 28 through which gas is inserted into the suction pipe 25 is arranged on the suction pipe 25. A outlet pipe 29 for the first oil-sealed rotary vacuum pump 26 and a outlet pipe 31 for a second oil-sealed rotary vacuum pipe 30 join into one pipe. The second oil-sealed rotary vacuum pump 30 evacuates air principally from the specimen exchange chamber 10. The second oil-sealed rotary vacuum pump 30 has a suction pipe 32, which is coupled to the specimen exchange chamber 10 through a stop valve 33. A pirani gauge 34 for measuring the pressure and a leak valve 35 through which gas is inserted into the suction pipe 32 are arranged between the stop valve 33 and the specimen exchange chamber on the suction pipe 32. The portion of the suction pipe 32 between the stop valve 33 and the second oil-sealed rotary vacuum pump 30 communicated with the another end of the manifold 17 through a bypass pipe 36 which is provided with a bypass valve 37. The portion of the suction pipe 32 between the stop valve 33 and the second oil-sealed rotary vacuum pump 30 is provided with a leak valve 38. The portion of the suction pipe 32 between the inlet of the second oil-sealed rotary vacuum pump 30 and the leak valve 38 is provided with a purge gas supply means 40 for supplying a small quantity of purge gas. The purge gas supply means 40 includes a purge gas pipe 41 one end of which is open to the atmosphere and another end of which is connected to the suction pipe 32 for the second oil-sealed rotary vacuum pump 30, a microflow rate adjusting orifice 42 which is arranged on the purge as pipe 41 and which limits a quantity of gas flowing through the purge gas pipe 41, and a filter 43 arranged o the purge gas pipe 41 between the orifice 42 and the atomosphere.

The operation of the first embodiment will be described below. After the specimen 9 has been set in the specimen chamber 3, the first roughing valve 14A, the second roughing valve 14B, the third roughing valve 14C, the manifold valve 16, the manifold gate valve 22, and the valve 27 for the first oil-sealed rotary vacuum pump 26 are opened, the leak valve 21, the leak valve 28, the leak valve 38, the bypass valve 37, the gate valve 11, and the stop valve 33 are closed, and the first and second oil-sealed rotary vacuum pumps 26 and 30 are operated to evacuate air from the microscope column 2 and from a part of the suction pipe 32 between the stop valve 33 and the second oil-sealed rotary vacuum pump 30. The pressure in the manifold 17 is measured with the Pirani gauge 19 arranged in the manifold 17. When the pressure in the manifold 17 has reached a predetermined pressure, the turbo molecular pump 24 is operated to evacuate air in cooperation with the first oil-sealed rotary vacuum pump 26. The pressure in the manifold 17 is measured with the Penning gauge 20 arranged in the manifold 17. When it has reached a predetermined pressure, the ion pumps 12A to 12C are operated for main pumping. After the main pumping has been finished, the specimen 9 in the specimen chamber 3 is scanned. After the scanning of the specimen 9 is performed, a new specimen is set into the specimen exchange chamber to replace the specimen 9 which has been scanned. Subsequently, the stop valve 33 is opened, and the air in the specimen exchange chamber 10 is evacuated. After the leak valve 35 has been closed and the air in the specimen exchange chamber 10 has been evacuated to a predetermined pressure, the stop valve 33 is closed. Subsequently, the gate valve 11 is opened, the specimen 9 is replaced, and the gate valve 11 is closed. The air in the microscope column 2 is again evacuated to a predetermined pressure, and scanning is then performed. During this time, gas is inserted into the specimen exchange chamber 10 through the leak valve 35 so as to make the pressure in the specimen exchange chamber 10 equal to the atmospheric pressure, and a subsequent specimen 9 is then set, thereby one cycle of analysis by the scanning electron microscope is performed.

When the air in the specimen exchange chamber 10 is evacuated by the second oil-sealed rotary vacuum pump 30 at the substantially ultimate pressure of the vacuum pump, the backstreaming of oil rapidly increases, contaminating the specimen exchange chamber 10 and the specimen 9. Further, when the gate valve 11 is opened, a stream flows from the specimen exchange chamber 10 to the specimen chamber 3 due to the difference in pressure between the specimen chamber 3 and the specimen exchange chamber 10, so that the oil contamination of the specimen exchange chamber 10 spreads into the specimen chamber 3. In order to suppress this oil contamination, the purge gas supply means 40 supplies a small quantity of purge gas to the inlet side of the second oil-sealed rotary vacuum pump 30 while the air in the specimen exchange chamber 10 is evacuated by the second oil-sealed rotary vacuum pump 30. The present embodiment employs clean air which has been passed through the filter 43. The air passes through the filter 43, the orifice 42, and the purge gas pipe 41, and is supplied to the inlet side of the second oil-sealed rotary vacuum pump 30. A chemically stable inert gas is preferable as a purge gas. However, nitrogen gas or clean air which contains no oil may be also effective. In the experiments, it was found that the larger the molecular weight of the gas to be supplied is the more the amount of the gas can be reduced. Table 1 shows the results of the experiments.

TABLE 1

| Type of gas | Quantity of gas for effective purging*) (SCCM) |
| --- | --- |
| Nitrogen gas (N$_2$) | 0.6 |
| Helium gas (He) | 12.7 |
| Argon gas (Ar) | 0.4 |

*)The quantity of gas for effective purging as shown in Table 1 was measured, when the oil contained in the gas evacuated with purging became about one hundredth in comparison with the oil in the gas evacuated without purging.

Figure 2:
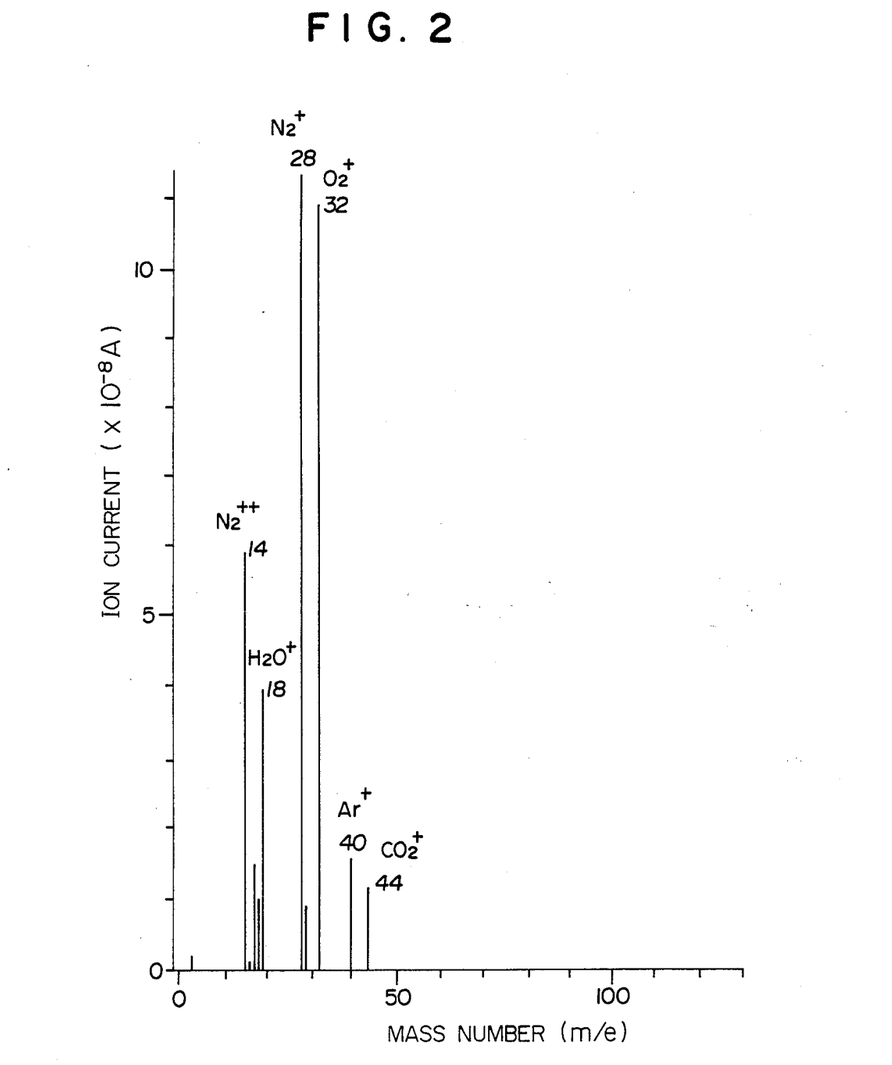
FIG. 2 is a mass spectrum of residual gas collected at the upstream side of the oil-sealed rotary vacuum pump of the apparatus for analysis when the purge gas is supplied.

FIG. 2 is a mass spectrum of the residual gas collected at the inlet side of the second oil-sealed rotary vacuum pump 30 when the second oil-sealed rotary vacuum pump 30 was operated at the almost ultimate pressure of the pump and the purging gas was inserted in the inlet side of the pump. The residual gas was analyzed by a quadrupole mass spectrometer. The ordinate represents degree of the ion current, and the abscissa represents degree of the mass number. FIG. 2 shows that a very clean state was provided.

Figure 3:
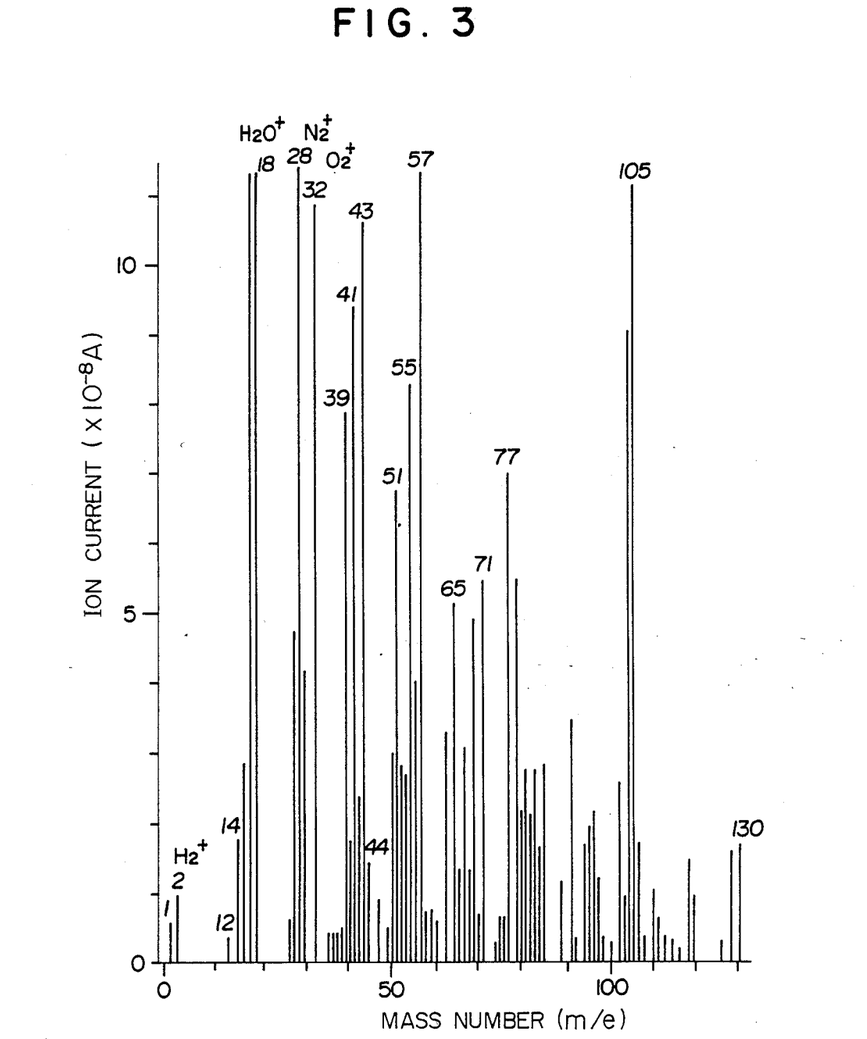
FIG. 3 shows a mass spectrum of residual gas collected at the upstream side of the oil-sealed rotary vacuum pump of the apparatus for analysis when the purge gas is not supplied.

FIG. 3 is a mass spectrum of the residual gas collected at the inlet side of the second oil-sealed rotary vacuum pump 30 when no purging gas was inserted. In FIG. 3, a large number of peaks corresponding to the (hydrocarbon) components of the oil used in the second oil-sealed rotary vacuum pump 30 are shown in a range of mass number larger than 39. From the above fact, it can be understood that oil backstreaming increased at a high degree in that range.

Figure 4:
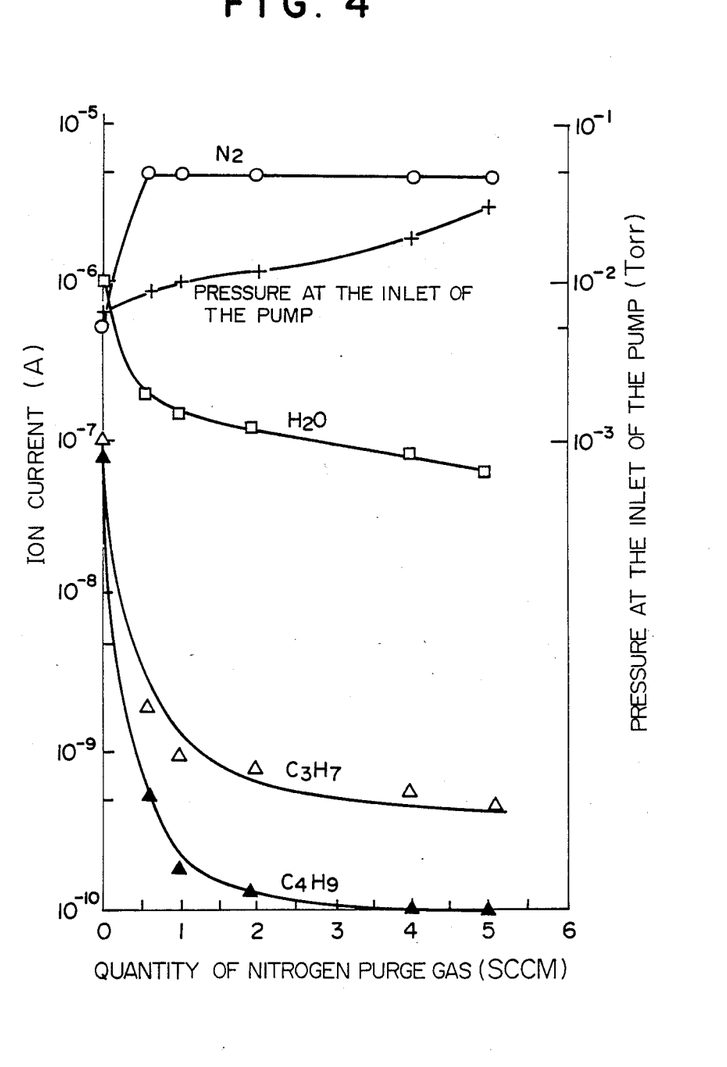
FIG. 4 shows the relationship among the amount of the purge gas, the spectral peaks of the residual gas components and the pressure at the inlet of the pump.

FIG. 4 shows the result of the experiment for making clear the relation among the purged quantity of nitrogen gas, the quantities of components of the residual gas and the pressure at the inlet of the second vacuum pump 39 (hereinafter referred to simply as the inlet pressure). The ordinate on the left side represents degree of the ion current for the detected peaks of the residual gas components, the ordinate on the right side represents degree of the inlet pressure, and the abscissa represents degree of the purged gas. In FIG. 4, when the quantity of purge gas is about 0.6 SCCM the peak values of the hydrocarbon components of the oil used in the oil-sealed rotary vacuum pump decrease by ninety-nine percent in comparison with the case of no-purging. As the quantity of purge gas increases further, the peaks of the hydrocarbon components decrease in proportion to the increase of purge gas. When the amount of purge gas exceeds more than about 4 SCCM, there is substantially no change in the peak values of the hydrocarbon components and in the decrease of the backstreaming of the oil, and the vacuum pressure by the pump increases. Practically it is suitable for the quantity of the purge gas to be within a range from about 0.3 SCCM to about 4 SCCM, because at about 0.3 SCCM, the peak values of the hydrocarbon components reduce to about one tenth in comparison with the case of no purging and because at more than about 4 SCCM, the values of in the peaks of the hydrocarbon components are substantially constant. Under such a purging condition, it is possible for the suction pressure of the pump to be about $7.5 \times 10^{-3}$ Torr to $2.5 \times 10^{-2}$ Torr.

As FIG. 4 shows, when a small quantity of purge gas is supplied each peak value of component of the oil contained in the evacuated air is about one hundredth in comparison with the case of no purging, so that a clean vacuum state is provided. The quantity of purge gas according to the present invention is very small in comparison with the conventional purging method. For example, the quantity of purge gas according to the present invention will be compared with the quantity of purge gas according to the conventional purging method under the condition that the oil-sealed rotary vacuum pump evacuates by 240 l/min.

S is the pumping speed of the oil-sealed rotary vacuum pump, Q is the throughput of the vacuum pump, and P is the inlet pressure, a relation between these components is expressed by the following equation:

$$Q = SP \qquad (1)$$

When S is 240 l/min and P is 0.1 Torr, the quantity of purge gas $Q_1$ supplied according to the conventional method is then expressed as follows.

$$Q_1 = 0.4 \text{ Torr l/S} \approx 32 \text{ SCCM}$$

As FIG. 4 shows, according to the present invention, an quantity of purge gas $Q_2$ enough for effective purging is 0.6 SCCM (when the ultimate pressure is at $7 \times 10^{-3}$ Torr). Therefore, $Q_2$ (=0.6 SCCM) is about one fifty-third in comparison with the conventional method. In consequence, the ultimate pressure of the vacuum pumping system according to the present invention can be lower than the pressure of 13 Pa (0.1 Torr) provided by the conventional purging method, and the vacuum state can be clean. How the interior of the specimen chamber 3 can be made clean by the supply of a very small quantity of purge gas will be explained below. That is, according to the analysis: although the change in the pressure caused by the supply of a small quantity of purge gas is small, by the supply of the purge gas the Knudsen number increases, and the state of the evacuated flow changes from a molecular flow to an intermediate flow. As the result, the frequency in collision between the oil particles and the purge gas particles increases substantially, so that the backstreaming of the oil is impeded remarkably. Further, the supply of purging gas generates a flow toward the vacuum pump, and the oil particles are carried thereto. Thus, in the present embodiment, a vacuum state in which the oil contamination is decreased is provided by slight reconstructions of equipments used in the vacuum system.

Figure 5:
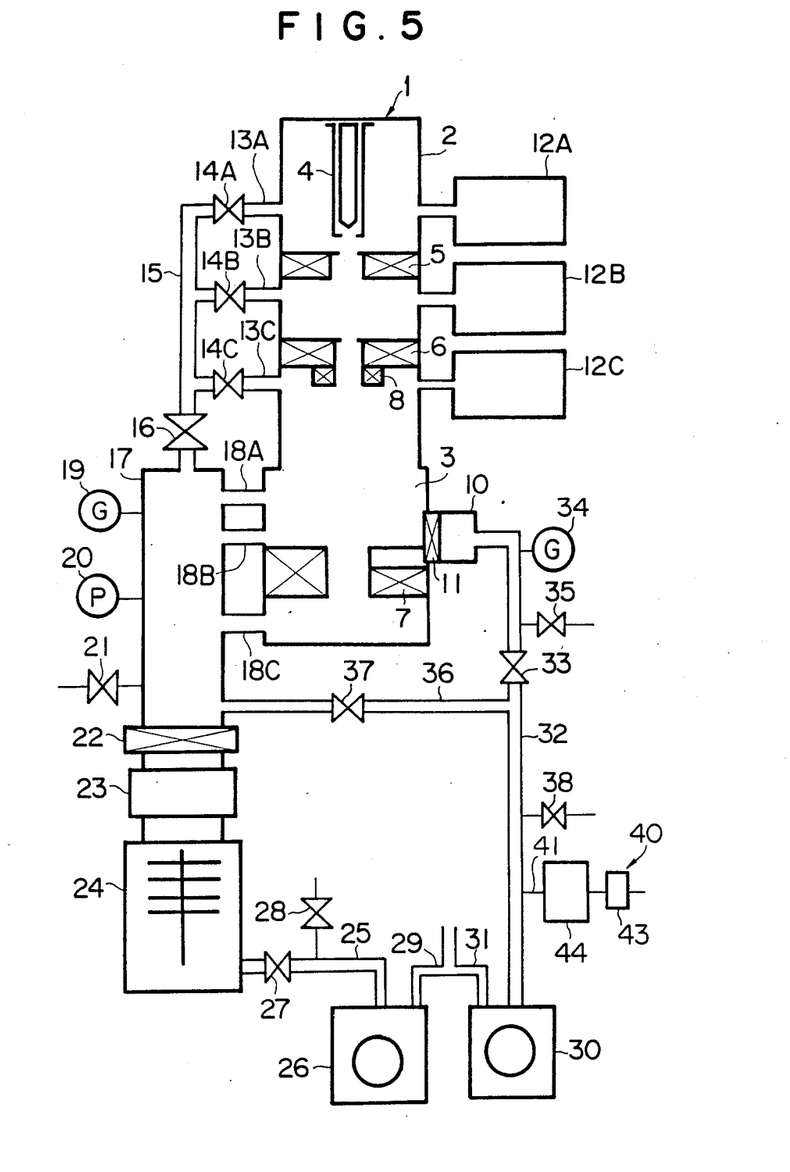
FIGS. 5 to 10 respectively show second, third, fourth, fifth, sixth and seventh embodiments of the present invention which is applied to electron microscopes.

FIG. 5 shows a second embodiment of the present invention in which the present invention is applied to a scanning electron microscope. Each of the parts shown in FIG. 5 and each of the parts shown in FIG. 1 which are identical with each other are denoted by the identical reference numeral. In this embodiment, the purge gas supply means 40 includes a mass flow controller 44 for controlling a flow rate of purge gas, instead of the orifice 42 included in the means 40 in the first embodiment.

In the present embodiment, since the flow rate of purge gas is always measured and controlled, the amount of purge gas does not change if the pressure at the inlet of the mass flow controller changes, so that the variation of pressure in vacuum system is very small.

Figure 6:
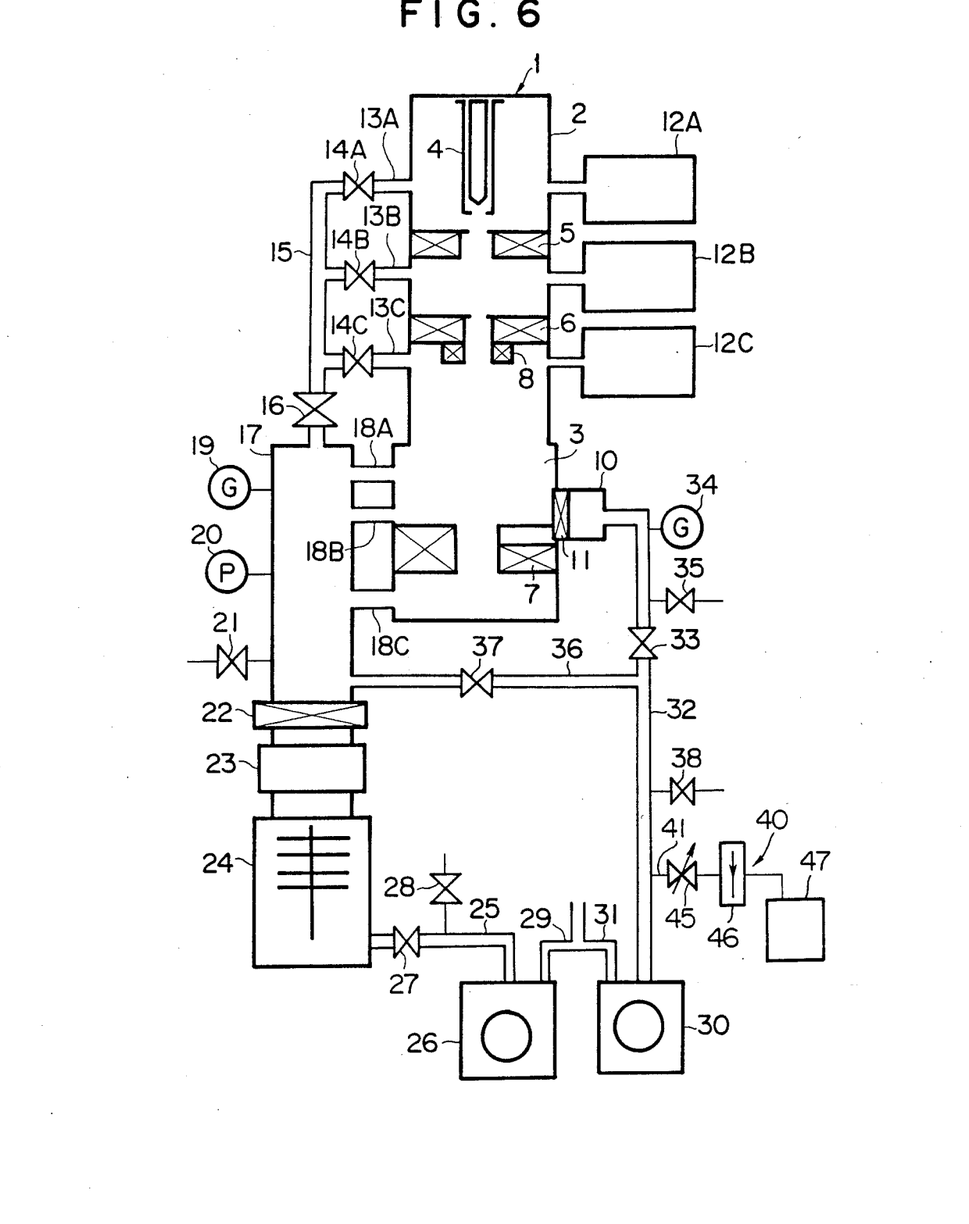

FIG. 6 shows a third embodiment of the present invention in which the present invention is applied to a scanning electron microscope. In this embodiment, the purge gas supply means 40 includes a microflow supply valve 45, a microflow meter 46, a purge gas source 47 and a purge gas pipe 41, and the purge gas is supplied not from the atmosphere but from the purge gas source 47. In this embodiment, the main components of residual gas are supplied from the purge gas source 47, so that the specimen can be surrounded by a desired gas as shown in FIG. 4.

Figure 7:
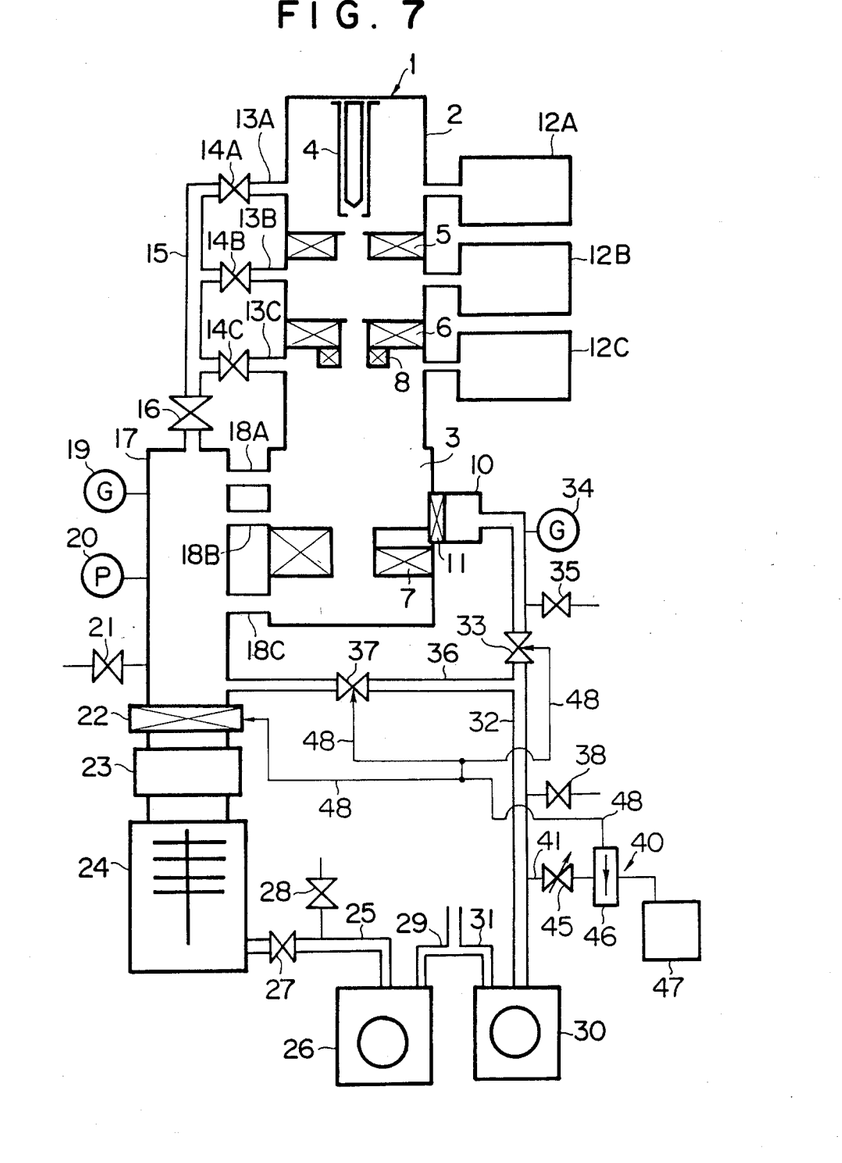

FIG. 7 shows a fourth embodiment of the present invention in which the present invention is applied to a scanning electron microscope. In this embodiment, the purge gas supply means 40 includes a microflow meter 46 which operates as a purging checker for checking whether or not a purge gas is flowing. The microflow meter 46 generates a signal for closing the manifold gate valve 22, the bypass valve 37 and the stop valve 33 when the quantity of purge gas is less than a predetermined level so that the oil contamination is prevented. The generated signal is transmitted through a valve control signal line 48. This system improves the reliability of the system.

Figure 8:
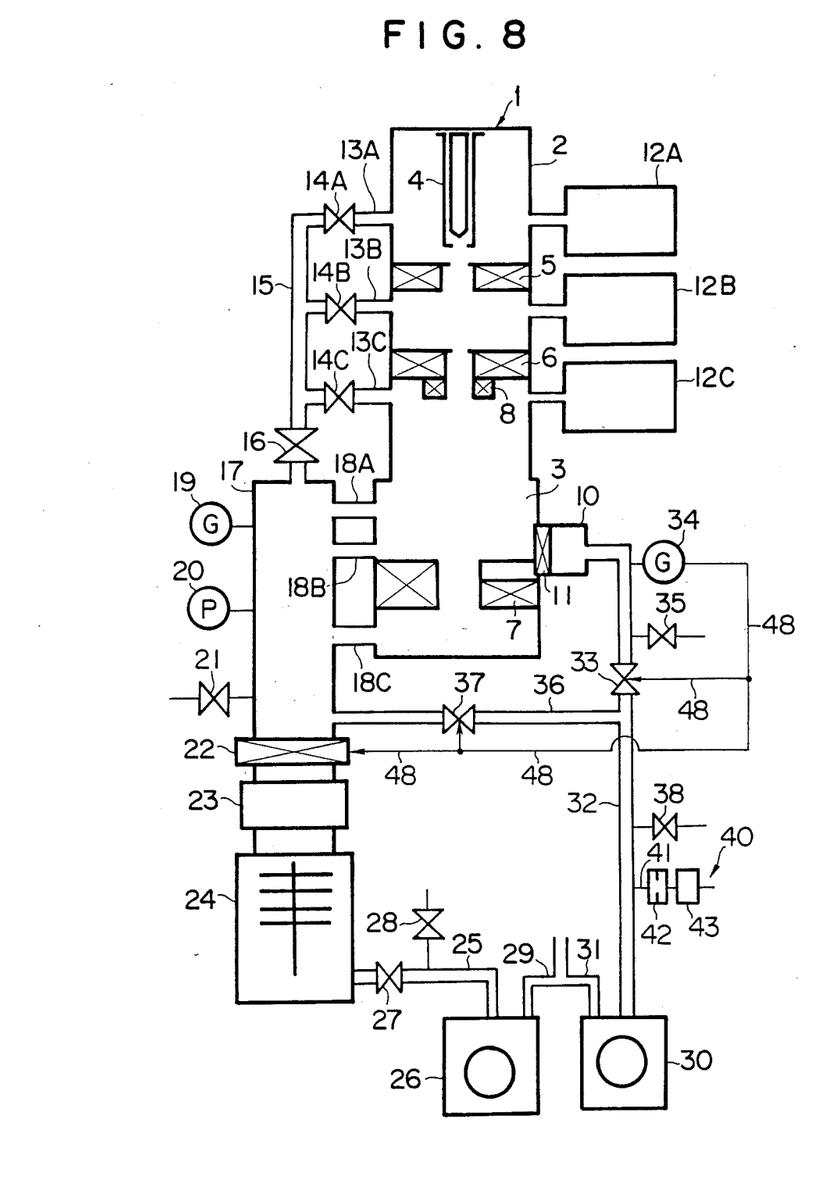

FIG. 8 shows a fifth embodiment of the present invention in which the present invention is applied to a scanning electron microscope. This embodiment employs a Pirani gauge 34 as the purging checker. When the flow rate of purge gas reduces to a predetermined value or below, the ultimate pressure of the second oil-sealed rotary vacuum pump 30 lowers, and oil contamination increases. The vacuum pressure which is the predetermined value or below is detected by the Pirani gauge 34 arranged in the suction pipe 32 between the specimen exchange chamber and the second vacuum pump 30, and the Pirani gauge 34 generates a signal to close the manifold gate valve 22, the bypass valve 37, and the stop valve 33. According to the present embodiment, the state in the inlet side of the second vacuum pump 30 is checked, so the reliability of the system is improved.

Figure 9:
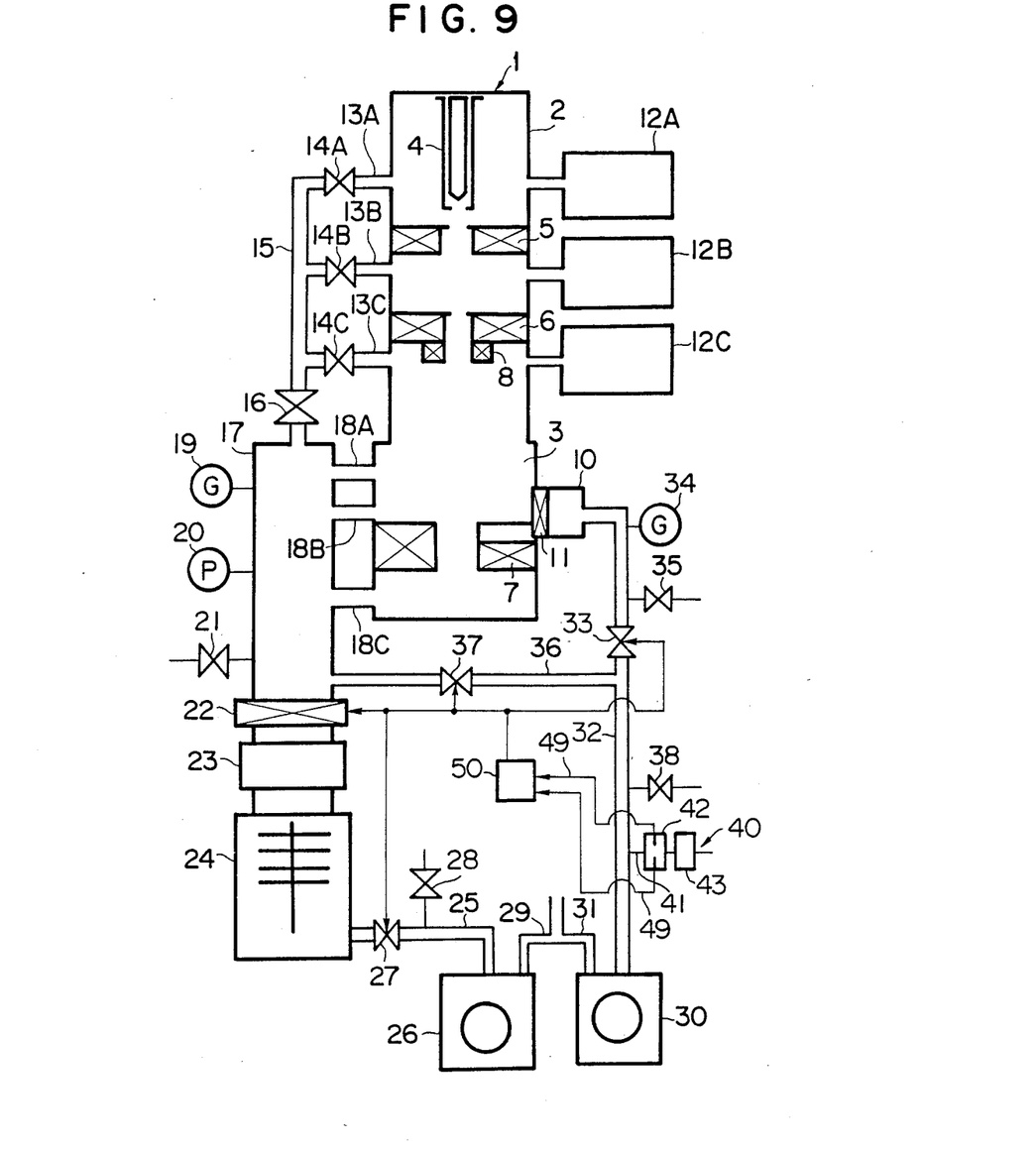

FIG. 9 shows a sixth embodiment of the present invention in which the present invention is applied to a scanning electron microscope. This embodiment includes, as a purging checker, optical fiber cables 49 for detecting the clogging of the microflow orifice 42, and a detector 50 for judging whether the orifice clogs up or not and for generating a signal to open or close the valves. The optical fibers 49 face each other at an end of the microflow orifice 42. A ray of light inserted into an end of the optical fiber 49 is detected by the detector 50 when the purge gas flows through the orifice 42. However, if the microflow orifice 42 is clogged by a foreign substance, the ray of light is interrupted, and no light is detected by the detector 50. Since oil contamination increases when no purge gas is supplied, the detector 50 judges whether the orifice clogs up or not and generates the signal for closing the manifold gate valve 22, the bypass valve 37 and the stop valve 33. In this embodiment, the clogging of the microflow orifice 42 is always monitored, so that the reliability of the system is improved.

Figure 10:
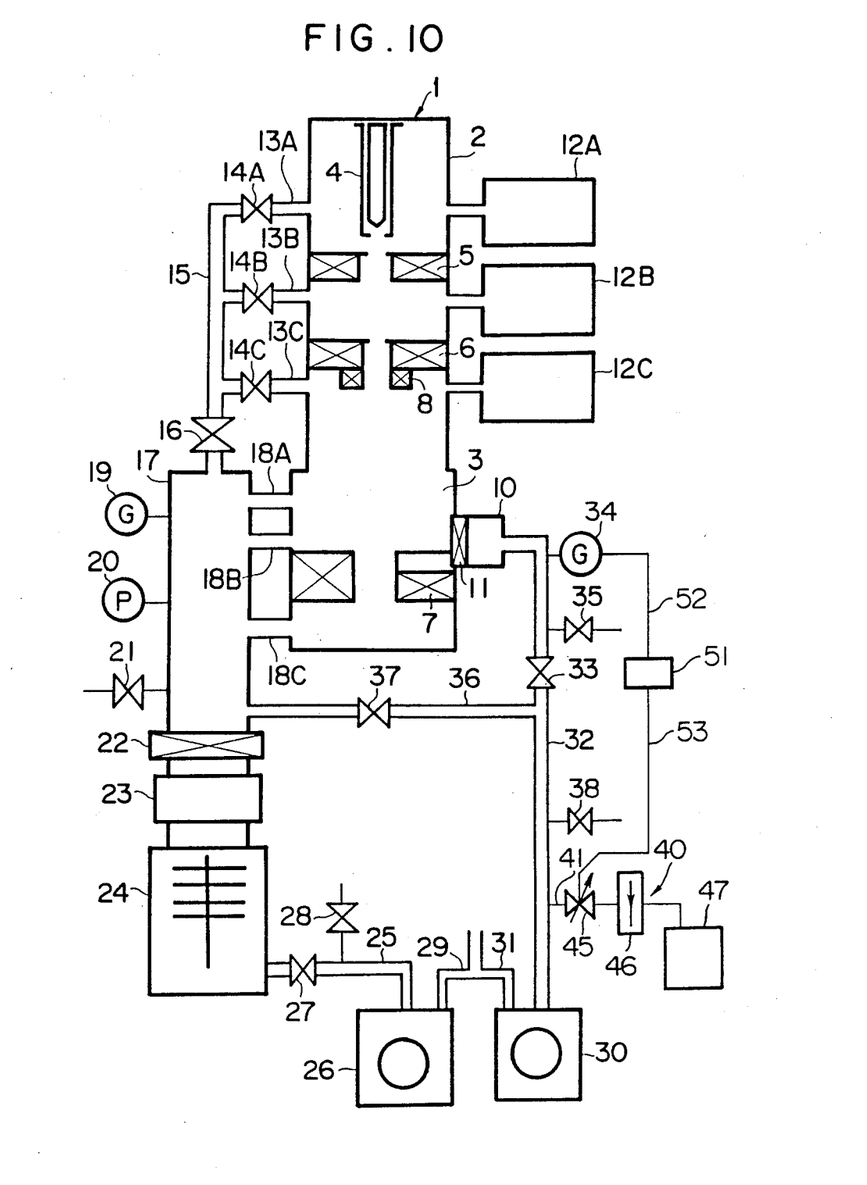

FIG. 10 shows a seventh embodiment of the present invention in which the present invention is applied to a scanning electron microscope. This embodiment includes a purge gas supply means 40 for supplying a controlled quantity of purge gas to the inlet side of the second oil-sealed rotary vacuum pump 30 according to the pressure of the inlet side of the second oil-sealed rotary vacuum pump 30. The purge gas supply means 40 in this embodiment includes a microflow supply valve 45, a microflow meter 46, a purge gas source 47, a pressure signal line 52, a microflow valve control signal line 53 and a microflow valve controller 51. In this embodiment, the Pirani gauge 34 measures the pressure of the inlet side of the second oil-sealed rotary vacuum pump 30, generates a signal in accordance with the measured pressure and transmits the signal through the pressure signal line 52 to the microflow valve controller 51. According to the transmitted signal, the microflow valve controller 51 generates and transmits a signal for controlling the opening degree of the microflow supply valve 45 through the microflow valve control signal line 53 to the microflow supply valve 45 so that the opening degree of the microflow supply valve 45 increases or decreases in accordance with a difference between the measured pressure and the predetermined pressure. When the measured pressure is larger than the predetermined pressure, the microflow valve controller 51 generates the signal for decreasing the opening degree of the microflow supply valve 45. When the measured pressure is smaller than the predetermined pressure, the microflow valve controller 51 generates the signal for increasing the opening degree of the microflow supply valve 45. When the measured pressure is equal to the predetermined pressure, the microflow valve controller 51 generates the signal for maintaining the opening degree of the microflow supply valve 45 as it is. As described above, the pressure of the inlet side of the second oil-sealed rotary vacuum pump 30 is maintained within a suitable range. As in this embodiment the quantity of the supplied purge gas is automatically controlled, the reliability and economical efficiency of the system are improved.

In the above-described embodiments, the present invention is applied to a scanning electron microscope. However, the present invention can also be applied to a transmission type electron microscope, a mass spectrometer or an ion microanalyzer.

As the above description shows, since the backstreaming of the oil used in the oil-sealed rotary vacuum pump toward the inlet side of the vacuum pump is suppressed when the air in the specimen exchange chamber is evacuated by the oil-sealed rotary vacuum pump to the ultimate pressure of the pump, a clean vacuum state is provided in the specimen exchange chamber, further the specimen chamber is not contaminated with the oil when a specimen is delivered into the specimen chamber, so that an analysis system employing electron in which oil contamination of the vacuum system is prevented can be provided.

What is claimed is:

1. An analysis system for analyzing a specimen with electrons, comprising:
   an electron generating source for generating electrons;
   a specimen chamber which is irradiated with the electrons generated by said electron generating source;
   a specimen exchange chamber arranged on said specimen chamber so that the specimen is inserted into said specimen chamber from said specimen exchange chamber;
   a first oil-sealed rotary vacuum pump for main pumping and roughing, said first oil-sealed rotary vacuum pump is connected to said specimen chamber to evacuate air in said specimen chamber;
   a second oil-sealed rotary vacuum pump connected through a suction pipe to said specimen exchange chamber to evacuate air in said specimen exchange chamber; and
   a purge gas supply means for supplying a small quantity of purge gas to said suction pipe of said second oil-sealed rotary vacuum pump.

2. An analysis system according to claim 1, wherein said purge gas supply means includes a purge gas pipe one end of which is open to the atmosphere and another end of which is connected to said suction pipe for said second oil-sealed rotary vacuum pump, and a microflow rate adjuster arranged in said purge gas pipe.

3. An analysis system according to claim 2, wherein said microflow rate adjuster is an orifice.

4. An analysis system according to claim 2, wherein said microflow rate adjuster is a flow rate adjusting valve.

5. An analysis system according to claim 2, wherein said purge gas supply means includes a detector for detecting the clogging of said purge gas pipe, and said suction pipe for said second oil-sealed rotary vacuum pump includes a valve, said detector generating a signal for closing said valve of said suction pipe.

6. An analysis system according to claim 2, wherein said analysis system including a detector for detecting the flow of purge gas in said suction pipe, said detector being arranged in said suction pipe for said second oil-sealed rotary vacuum pump, and said suction pipe includes a valve, said detector generating a signal for closing said valve of said suction pipe.

7. An analysis system according to claim 2, wherein said purge gas supply means includes a microflow valve controller, said microflow valve controller controlling said microflow rate adjuster so that the quantity of the supplied purge gas is in inverse proportion to the pressure of the inlet side of said second oil-sealed rotary vacuum pump.

8. An analysis system according to claim 2, wherein the pressure of the inlet side of said second oil-sealed rotary vacuum pup is between 0.007 Torr and 0.025 Torr, when said purge gas supply means supplies purge gas.

9. In an analysis method for analyzing a specimen, comprising, setting said specimen in a specimen exchange chamber, evacuating air in said specimen exchange chamber by a second oil-sealed rotary vacuum pump, transferring said specimen from said specimen exchange chamber to a specimen chamber, evacuating air in said specimen chamber by a first oil-sealed rotary vacuum pump, and analyzing said specimen in said specimen chamber with electrons, the improvement comprising, supplying a small quantity of purge gas to the inlet side of said second oil-sealed rotary vacuum pump when air in said specimen exchange chamber is evacuated by said second oil-sealed rotary vacuum pump.

10. An analysis method according to claim 9, wherein said purge gas is clean air.

11. An analysis method according to claim 9, wherein said purge gas is at least one selected from the group consisting of nitrogen gas, helium gas and argon gas.

* * * * *